(12) United States Patent
Pan et al.

(10) Patent No.: US 9,850,126 B2
(45) Date of Patent: Dec. 26, 2017

(54) INTEGRATED CIRCUIT PACKAGE AND METHOD OF FORMING SAME

(71) Applicant: Taiwan Semiconductor Manufacturing Company, Ltd., Hsin-Chu (TW)

(72) Inventors: Kuo Lung Pan, Hsin-Chu (TW); Chung-Shi Liu, Hsin-Chu (TW); Hao-Yi Tsai, Hsin-Chu (TW); Yu-Feng Chen, Hsin-Chu (TW); Yu-Jen Cheng, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/986,189

(22) Filed: Dec. 31, 2015

(65) Prior Publication Data

US 2017/0190572 A1 Jul. 6, 2017

(51) Int. Cl.
| | | |
|---|---|---|
| H01L 21/44 | (2006.01) | |
| B81C 1/00 | (2006.01) | |
| B81B 7/00 | (2006.01) | |
| H01L 23/31 | (2006.01) | |
| H01L 23/48 | (2006.01) | |
| H01L 23/00 | (2006.01) | |
| H01L 23/498 | (2006.01) | |
| H01L 21/56 | (2006.01) | |

(52) U.S. Cl.
CPC ........... *B81C 1/0023* (2013.01); *B81B 7/007* (2013.01); *H01L 21/565* (2013.01); *H01L 23/3107* (2013.01); *H01L 23/481* (2013.01); *H01L 23/49838* (2013.01); *H01L 24/09* (2013.01); *B81B 2207/012* (2013.01); *B81B 2207/07* (2013.01); *B81C 2203/0792* (2013.01); *H01L 2224/0231* (2013.01); *H01L 2224/05024* (2013.01); *H01L 2224/05025* (2013.01); *H01L 2224/08225* (2013.01); *H01L 2924/14* (2013.01); *H01L 2924/1461* (2013.01)

(58) Field of Classification Search
CPC .................................................. H01L 21/7806
USPC ..................................................... 438/114, 210
See application file for complete search history.

(56) References Cited

U.S. PATENT DOCUMENTS

| | | | |
|---|---|---|---|
| 7,993,941 B2* | 8/2011 | Huang | ................ H01L 21/6835 257/690 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |

(Continued)

*Primary Examiner* — Chandra Chaudhari
(74) *Attorney, Agent, or Firm* — Slater Matsil, LLP

(57) ABSTRACT

Integrated circuit packages and methods of forming same are provided. A method includes attaching a first die and a second die to a carrier, the first die having a first contact pad, the second die having a second contact pad, the first contact pad and the second contact pad having different structures. A release layer is formed over the first die and the second die. An encapsulant is injected between the carrier and the release layer. One or more redistribution layers (RDLs) are formed over the first die, the second die and the encapsulant, the first contact pad and the second contact pad being in electrical contact with the one or more RDLs.

20 Claims, 13 Drawing Sheets

(56) References Cited

U.S. PATENT DOCUMENTS

| | | | |
|---|---|---|---|
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 8,916,481 | B2 * | 12/2014 | Gan ................ H01L 21/486 438/127 |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |

* cited by examiner

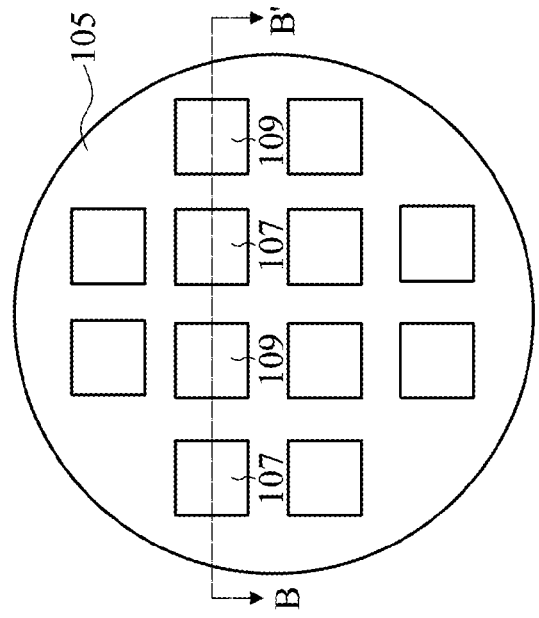
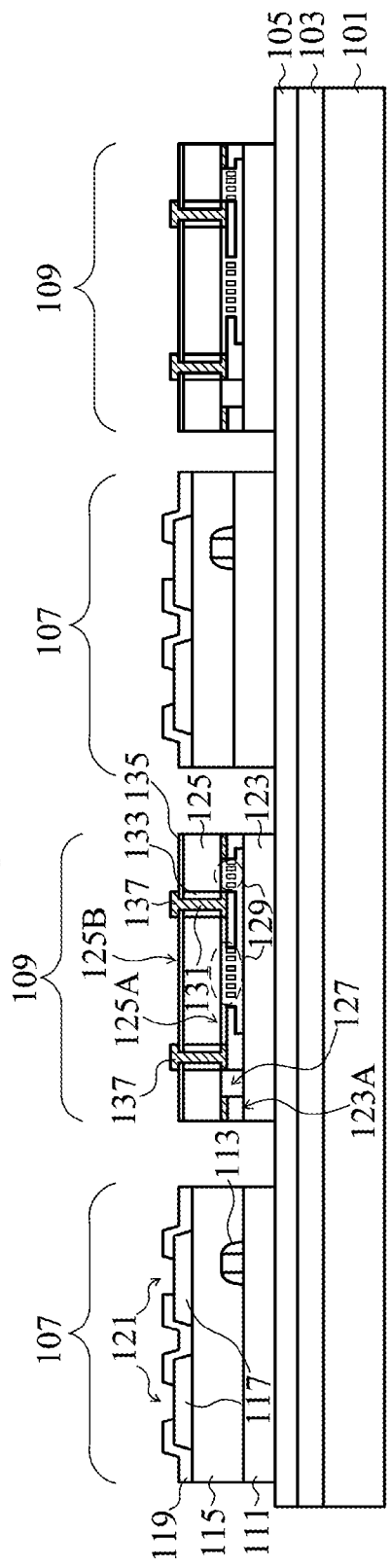
Figure 1A
Figure 1B

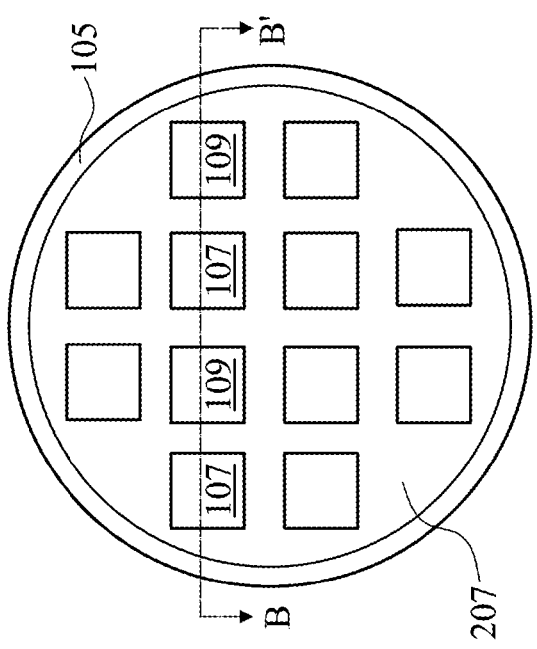
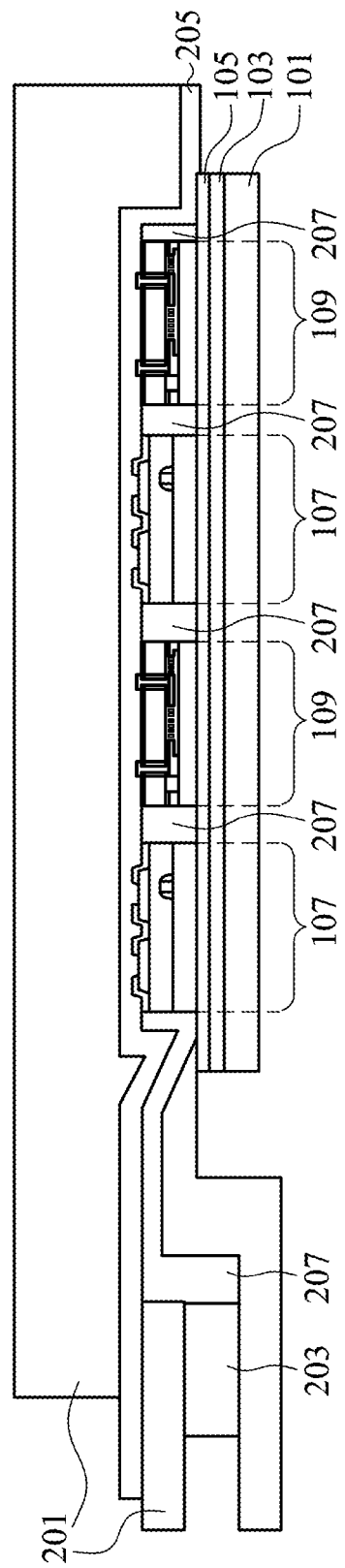
Figure 4A
Figure 4B

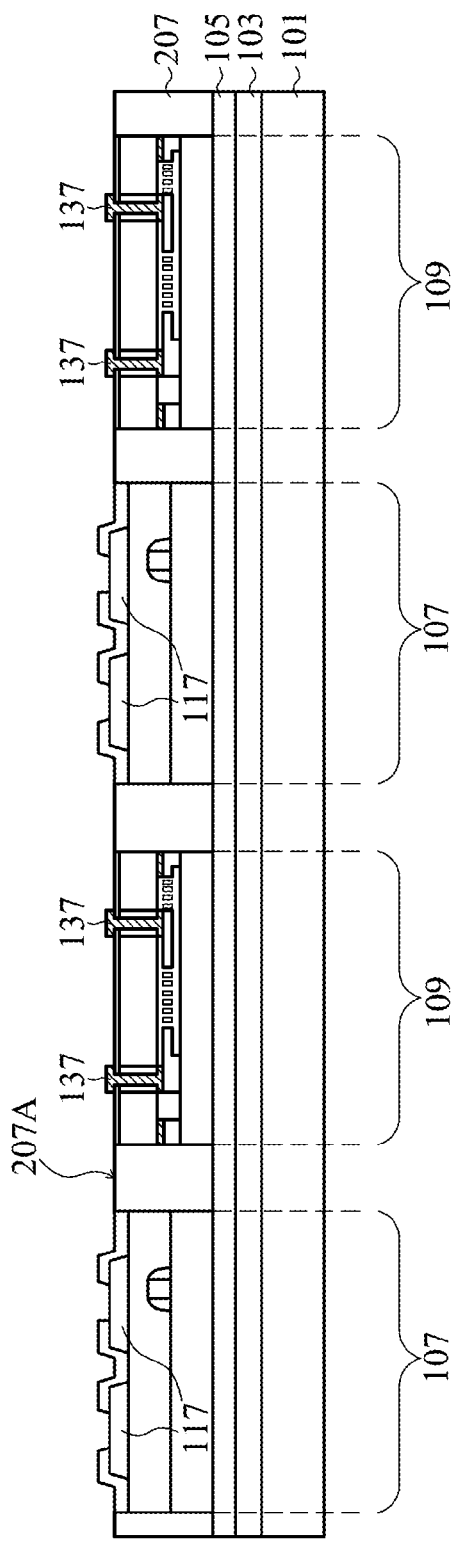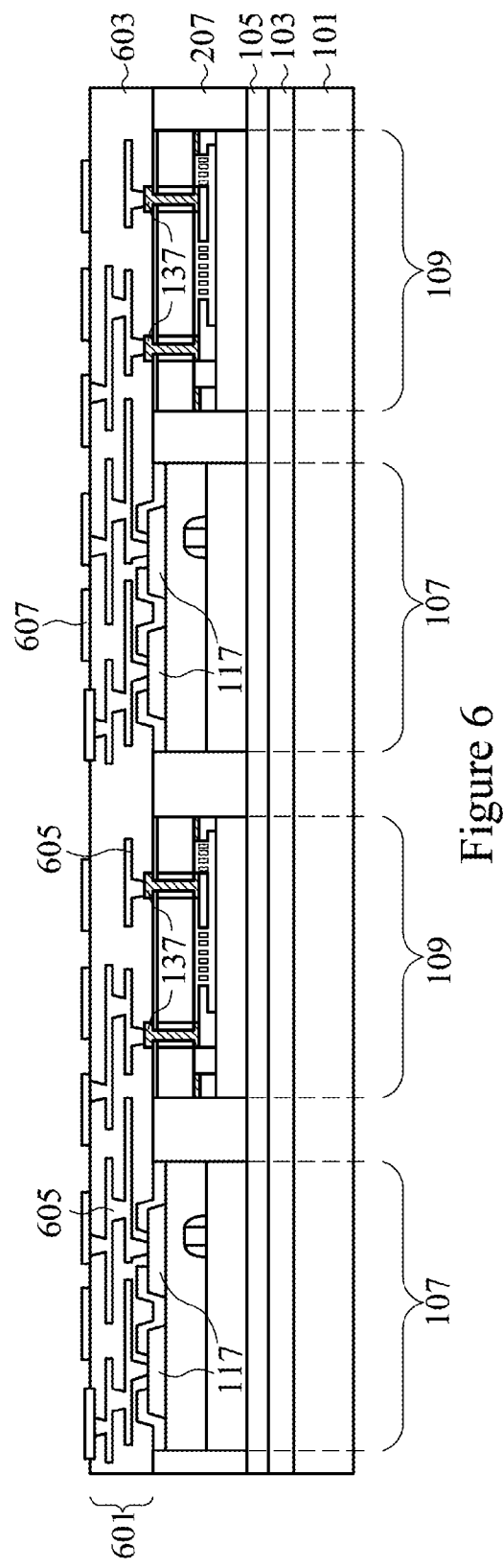

INTEGRATED CIRCUIT PACKAGE AND METHOD OF FORMING SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (POP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 2A, 2B, 3A, 3B, 4A, 4B, and 5-7 are top and cross-sectional views of various processing steps during fabrication of integrated circuit packages in accordance with some embodiments.

DETAILED DESCRIPTION

Figure 2A:
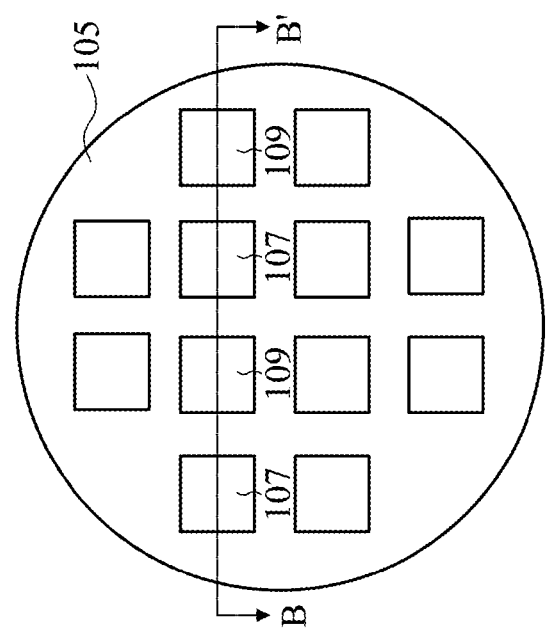

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the disclosed embodiments will be addressed generally. Described below are various integrated circuit packages and methods for forming the same. Methods such as described below allow for packaging integrated circuit dies having different contact pad structures into a same integrated circuit package. Accordingly, such methods allow for greater flexibly for packaging integrated circuit dies having different functionalities into a same integrated circuit package. Moreover, methods such as described below allow for eliminating certain process steps and allow for reducing manufacturing costs. Throughout the various views and illustrative embodiments, like reference numbers are used to designate like elements.

FIGS. 1A, 1B, 2A, 2B, 3A, 3B, 4A, 4B, and 5-7 are top and cross-sectional views of various processing steps during fabrication of integrated circuit packages in accordance with some embodiments, where an "A" figure represents a top view and a "B" figure represents a cross-sectional view along the B-B' line of the respective "A" figure.

Referring first to FIGS. 1A and 1B, a carrier 101 having a plurality of first integrated circuit (IC) dies 107 and a plurality of second IC dies 109 attached thereon is illustrated in accordance with some embodiments. In some embodiments, a release layer 103 is formed over the carrier 101, an adhesive layer 105 is formed over the release layer 103, and the first IC dies 107 and the second IC dies 109 are attached to the adhesive layer 105. In some embodiments, the carrier 101 may be formed of silicon, quartz, glass, or the like, and provides mechanical support for subsequent operations. In some embodiments, the release layer 103 may comprise a light to heat conversion (LTHC) material, a ultraviolet (UV) glue (which loses its adhesive property when exposed to UV radiation), or the like, and may be formed using a spin-on coating process, a printing process, a lamination process, or the like. In some embodiments in which the release layer 103 is formed of an LTHC material, the release layer 103 partially or fully loses its adhesive strength when exposed to light and the carrier 101 can be easily detached from the first IC dies 107 and the second IC dies 109. The adhesive layer 105 may be a die attach film (DAF) or any suitable adhesive, epoxy, UV glue, or the like, and may be formed using a spin-on coating process, a printing process, a lamination process, or the like. In some embodiments, the first IC dies 107 and the second IC dies 109 are attached to the carrier 101 using, for example, a pick and place apparatus. In other embodiments, the first IC dies 107 and the second IC dies 109 may be attached to the carrier 101 manually, or using any other suitable method.

In some embodiments, the first IC dies 107 and the second IC dies 109 may be complementary metal-oxide-semiconductor (CMOS) dies, micro-electro-mechanical systems (MEMS) dies, or the like. The first IC dies 107 and the second IC dies 109 may have variety of functionalities and may include memory dies, microcontroller unit (MCU) chips, power management integrated circuit (PMIC) chips, radio frequency (RF) chips, application-specific integrated circuit (ASIC) chips, liquid crystal displays (LCDs), light emitting diode (LED) displays, touch sensors, motion sensors, heart rate sensors, ambient sensors such as temperature sensors, pressure sensors, humidity sensors, particle sensors, and the like. In some embodiments, the first IC dies 107 and the second IC dies 109 may be formed as part of a wafer, which is subsequently singulated into individual first IC dies 107 and individual second IC dies 109. In some embodiments, the wafer is singulated by sawing, laser ablation, or the like. Subsequently, functional testing may be performed on the first IC dies 107 and the second IC dies 109. Thus, the first IC dies 107 and the second IC dies 109 illustrated in FIGS. 1A and 1B may include only known good dies (KGDs), which have passed one or more functional quality tests. In the illustrated embodiment, the first IC dies 107 are CMOS dies and the second IC dies 109 are MEMS dies. In other embodiments, the first IC dies 107 and the second IC dies 109 may be MEMS dies. In yet other embodiments, the first IC dies 107 and the second IC dies 109 may be CMOS dies. Furthermore, as illustrated in FIG. 1B, top sides of the first IC dies 107 and the second IC dies 109 have different contact pad structures. However, in other embodiments, the first IC dies 107 and the second IC dies 109 have similar contact pad structures.

Referring further to FIGS. 1A and 1B, in some embodiments in which the first IC dies 107 are CMOS dies, each of the first IC dies 107 comprises a substrate 111, one or more active and/or passive devices 113 on the substrate 111, and one or more metallization layers 115 over the substrate 111 and the one or more active and/or passive devices 113. In some embodiments, the substrate 111 may be formed of silicon, although it may also be formed of other group III, group IV, and/or group V elements, such as silicon, germanium, gallium, arsenic, and combinations thereof. The substrate 111 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the one or more active and/or passive devices 113 may include various n-type metal-oxide semiconductor (NMOS) and/or p-type metal-oxide semiconductor (PMOS) devices such as transistors, capacitors, resistors, diodes, photo-diodes, fuses and/or the like. The one or more metallization layers 115 may include an inter-layer dielectric (ILD)/inter-metal dielectric layers (IMDs) and conductive layers (not shown) separated by neighboring ILD/IMDs formed over the substrate 111. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), the like, or a combination thereof. In some embodiments, interconnect structures may be formed in the ILD/IMDs using, for example, a damascene process, a dual damascene process, or the like. In some embodiments, interconnect structures may comprise copper, a copper alloy, silver, gold, tungsten, tantalum, aluminum, or the like. In some embodiments, the interconnect structures may provide electrical connections between the one or more active and/or passive devices 113 formed on the substrate 111.

In some embodiments, each of the first IC dies 107 further includes contact pads 117 formed over the one or more metallization layers 115 and may be electrically coupled to the one or more active and/or passive devices 113 through various interconnect structures of the one or more metallization layers 115. In some embodiments, the contact pads 117 may comprise a conductive material such as aluminum, copper, tungsten, silver, gold, nickel, the like, or a combination thereof. In some embodiments, a conductive material may be formed over the one or more metallization layers 115 using, for example, physical vapor deposition (PVD), atomic layer deposition (ALD), electro-chemical plating, electroless plating, the like, or a combination thereof. In some embodiments in which the conductive material is aluminum, the conductive material is patterned to form the contact pads 117. In some embodiments, the conductive material may be patterned using photolithography techniques. Generally, photolithography techniques involve depositing a photoresist material (not shown), which is subsequently irradiated (exposed) and developed to remove a portion of the photoresist material. The remaining photoresist material protects the underlying material, such as the conductive material of the contact pads 117 from subsequent processing steps, such as etching. A suitable etching process, such as a reactive ion etch (RIE) or other dry etch, an isotropic or anisotropic wet etch, or any other suitable etch or patterning process may be applied to the conductive material to remove exposed portions of the conductive material and form the contact pads 117. In some embodiments in which the conductive material is aluminum, the conductive material may be etched using a mixture of 80% phosphoric acid, 5% nitric acid, 5% acetic acid, and 10% de-ionized (DI) water. Subsequently, the photoresist material may be removed using, for example, an ashing process followed by a wet clean process.

Referring further to FIGS. 1A and 1B, a passivation layer 119 is formed over the substrate 111 and the contact pads 117. In some embodiments, the passivation layer 119 may comprise one or more layers of photo-patternable dielectric materials such as polybenzoxazole (PBO), polyimide (PI), benzocyclobutene (BCB), or the like, and may be formed using a spin-on coating process, or the like. Such photo-patternable dielectric materials may be easily patterned using similar photolithography methods as a photoresist material. In other embodiments, the passivation layer 119 may comprise one or more layers of non-photo-patternable dielectric materials such as silicon nitride, silicon oxide, silicon oxynitride, phosphosilicate glass (PSG), borosilicate glass (BSG), boron-doped phosphosilicate glass (BPSG), or the like, and may be formed using CVD, PVD, ALD, a spin-on coating process, the like, or a combination thereof.

In some embodiments, openings 121 are formed in the passivation layer 119 to expose the contact pads 117. In some embodiments in which the passivation layer 119 is formed of a photo-patternable dielectric material, the passivation layer 119 may be patterned using similar photolithography methods as a photoresist material. In other embodiments in which the passivation layer 119 is formed of a non-photo-patternable dielectric material, a photoresist material (not shown) is formed over the passivation layer 119. The photoresist material is subsequently irradiated (exposed) and developed to remove a portion of the photoresist material. Subsequently, exposed portions of the passivation layer 119 are removed using, for example, a suitable etching process to form the openings 121. In some embodiments in which the passivation layer 119 is formed of silicon oxide, the passivation layer 119 is etched using, for example, buffered hydrofluoric acid (HF). In some embodiments in which the passivation layer 119 is formed of silicon nitride, the passivation layer 119 is etched using, for example, hot phosphoric acid ($H_3PO_4$). Subsequently, the photoresist material may be removed using, for example, an ashing process followed by a wet clean process.

Referring further to FIGS. 1A and 1B, in some embodiments in which the second IC dies 109 are MEMS dies, each of the second IC dies 109 comprises a MEMS substrate 123 bonded to a cap 125 and enclosing one or more cavities 127. In some embodiments, the MEMS substrate 123 and the cap 125 are bonded such that a front side 125A of the cap 125 faces a front side 123A of the MEMS substrate 123. The MEMS substrate 123 may be bonded to the cap 125 using any suitable technique such as fusion bonding (e.g., oxide-to-oxide bonding, metal-to-metal bonding, hybrid bonding, etc.), anodic bonding, eutectic bonding, the like, or a combination thereof. In some embodiments, the one or more cavities 127 may have a low pressure (high vacuum) as the bonding process may be performed in a low-pressure environment. In other embodiments, the one or more cavities 127 may have any suitable pressure depending on design requirements of the second IC dies 109.

In some embodiments, the MEMS substrate 123 may be formed using similar materials and methods as the substrate 111 and the description is not repeated herein. In some embodiments, each of the second IC dies 109 further includes various MEMS devices 129 on the front side 123A of the MEMS substrate 123 in the one or more cavities 127. The various MEMS devices 129 may include membranes, resonators, cantilevered elements, pressure sensors, accelerometers, motion sensors, gyroscopes, and the like and may be formed using suitable MEMS techniques. In some embodiments, the cap 125 may be a CMOS die and may be formed using similar materials and methods as the first IC dies 107. In other embodiments, the cap 125 may be a passive cap and may not have electrical circuits therein. In such embodiments, the cap 125 may be formed of a ceramic material, quartz, glass, or the like. The cap 125 may further include through vias (TVs) 131 extending from the front side 125A of the cap 125 to a backside 125B of the cap 125. The TVs 131 are configured to provide electrical connections between the various MEMS devices 129 and a circuitry that is external to the second IC dies 109. In the illustrated embodiment, the cap 125 further includes liner layers 133 along sidewalls of the TVs 131, a passivation layer 135 on the backside 125B of the cap 125 and contact pads 137 over the passivation layer 135 and contacting the TVs 131. In some embodiments, the liner layers 133 may comprise a suitable dielectric material and are configured to electrically isolate the TVs 131 from a material of the cap 125. In some embodiments, the TVs 131 and the contact pads 137 may comprise a conductive material such as aluminum, copper, tungsten, silver, gold, nickel, the like, or a combination thereof. In the illustrated embodiment, the TVs 131 and the contact pads 137 are formed of copper. In some embodiments, the passivation layer 135 may comprise one or more layers of silicon nitride, silicon oxide, silicon oxynitride, PSG, BSG, BPSG, or the like. Various processing steps during fabrication of the TVs 131 and the contact pads 137 are described below with reference to FIGS. 12-15.

Referring further to FIGS. 1A and 1B, the first IC dies 107 and the second IC dies 109 have different contact pad structures. In the illustrated embodiment, the contact pad structure of the first IC dies 107 include the contact pads 117 embedded in the passivation layer 119, and the contact pad structure of the second IC dies 109 include the contact pads 137 over the passivation layer 135 and in electrical contact with TVs 131. As described below in greater detail, an encapsulant will be formed over the carrier 101 and between the first IC dies 107 and the second IC dies 109. Subsequently, one or more redistribution layers (RDLs) will be formed over the first IC dies 107, the second IC dies 109, and the encapsulant.

FIGS. 2A, 2B, 3A, 3B, 4A and 4B illustrate top and cross-sectional views various processing steps during formation of an encapsulant 207 over the carrier 101, and between the first IC die 107 and the second IC dies 109 using a molding tool 201 in accordance with some embodiments. For the clarity of presentation, the molding tool 201 is omitted from the top views illustrated in FIGS. 2A, 3A and 4A. In the illustrated embodiment, a transfer molding method is used to encapsulate the first IC die 107 and the second IC dies 109. In other embodiments, other suitable molding processes may be also utilized. In some embodiments, the encapsulant 207 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the first IC die 107 and the second IC dies 109.

Figure 2B:
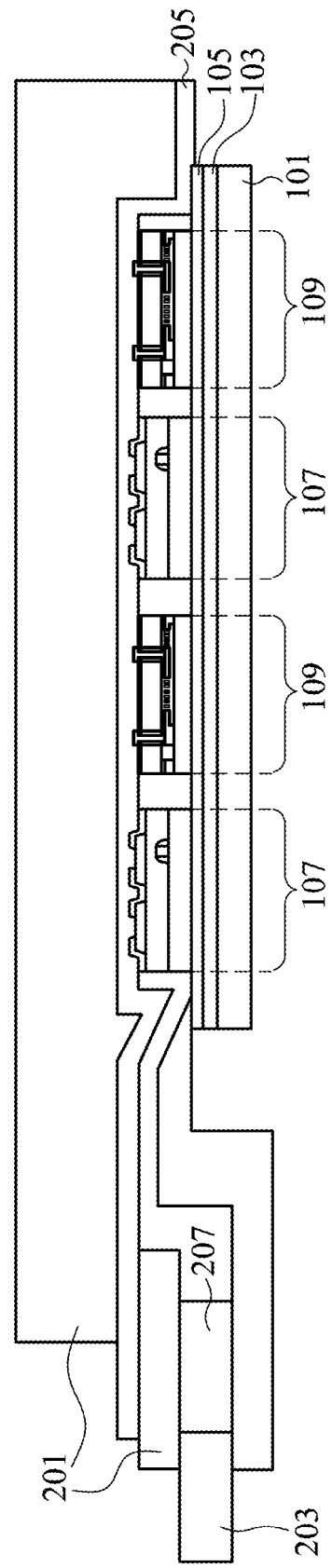

Referring first to FIGS. 2A and 2B, the molding tool 201 attaches a release layer 205 to the first IC dies 107 and the second IC dies 109. In some embodiments, the release layer 205 may be formed of a similar material as the release layer 103 and may be laminated on top surfaces of the first IC dies 107 and the second IC dies 109. In some embodiments, the molding tool 201 includes a plunger 203, which is configured to move in a lateral direction and transfer or inject the encapsulant 207 between the release layer 205 and the carrier 101, and in the gaps between the first IC dies 107 and the second IC dies 109.

Figure 3A:
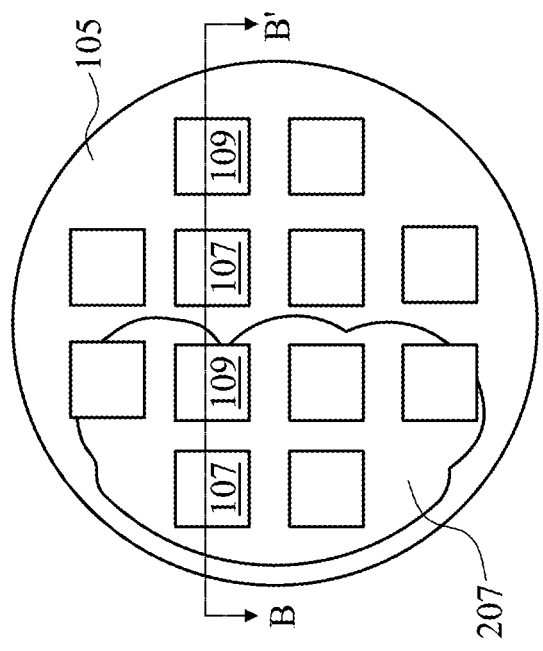
Figure 3B:
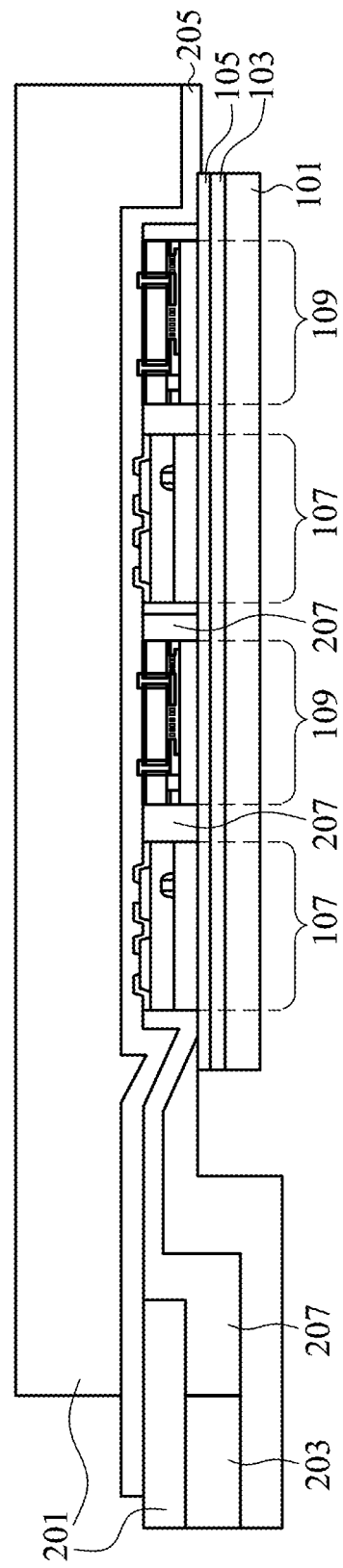

FIGS. 3A and 3B illustrate the encapsulant 207 that is partially injected between the release layer 205 and the carrier 101, and in the gaps between the first IC dies 107 and the second IC dies 109. In some embodiments, the plunger 203 injects the encapsulant 207 in a direction parallel to a major surface of the carrier 101, and the encapsulant 207 flows from an edge of the carrier 101 into an interior of the carrier 101.

FIGS. 4A and 4B illustrates a final stage of the encapsulation process. In some embodiments, the plunger 203 injects more encapsulant 207 between the release layer 205 and the carrier 101 until the encapsulant 207 completely fills the gaps between the first IC dies 107 and the second IC dies 109. Subsequently, the encapsulant 207 is cured using a UV curing, a thermal curing, or the like.

Referring to FIG. 5, after the encapsulation process is completed, the release layer 205 is removed and the top surfaces of the first IC dies 107 and the second IC dies 109 are exposed. By forming the encapsulant 207 using a method described above with reference to FIGS. 2A, 2B, 3A, 3B, 4A and 4B, the contact pads 117 of the first IC dies 107 and the contact pads 137 of the second IC dies 109 are not covered by the encapsulant 207 and are exposed after the release layer 205 is removed. As the encapsulant 207 is not covering the contact pads 117 of the first IC dies 107 and the contact pads 137 of the second IC dies 109, an encapsulant removal process such as a grinding process, a chemical mechanical polishing (CMP) process, or the like may be eliminated. Accordingly, top surfaces of the contact pads 117 and 137 may not be coplanar with a top surface 207A of the encapsulant 207. Furthermore, by forming the encapsulant 207 using a method described above with reference to FIGS. 2A, 2B, 3A, 3B, 4A and 4B, integrated circuit dies (such as the first IC dies 107 and the second IC dies 109) having different contact pad structures may be encapsulated without damaging the contact pad structures during the encapsulation process.

Referring to FIG. 6, one or more redistribution layers (RDLs) 601 are formed over the first IC dies 107, the second IC dies 109, and the encapsulant 207 and are electrically coupled to the contact pads 117 of the first IC dies 107 and the contact pads 137 of the second IC dies 109. In some embodiments, the RDLs 601 comprise one or more dielectric layers 603 and one or more conductive features 605 (such as conductive lines or traces and vias) disposed within the one or more dielectric layers 603. In some embodiments, the one or more dielectric layers 603 may comprise dielectric materials such as PBO, PI, BCB, or the like, and may be formed using a spin-on coating process, or the like. In some embodiments, the one or more conductive features 605 may comprise copper, tungsten, aluminum, silver, gold, the like, or a combination thereof, may be formed using an electrochemical plating process, an electroless plating process, ALD, PVD, the like, or a combination thereof.

Referring further to FIG. 6, underbump metallizations (UBMs) 607 are formed over and electrically coupled to the one or more RDLs 601. In some embodiments, the UBMs 607 may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 607. Any suitable materials or layers of materials that may be used for the UBMs 607 are fully intended to be included within the scope of the current application.

Figure 7:
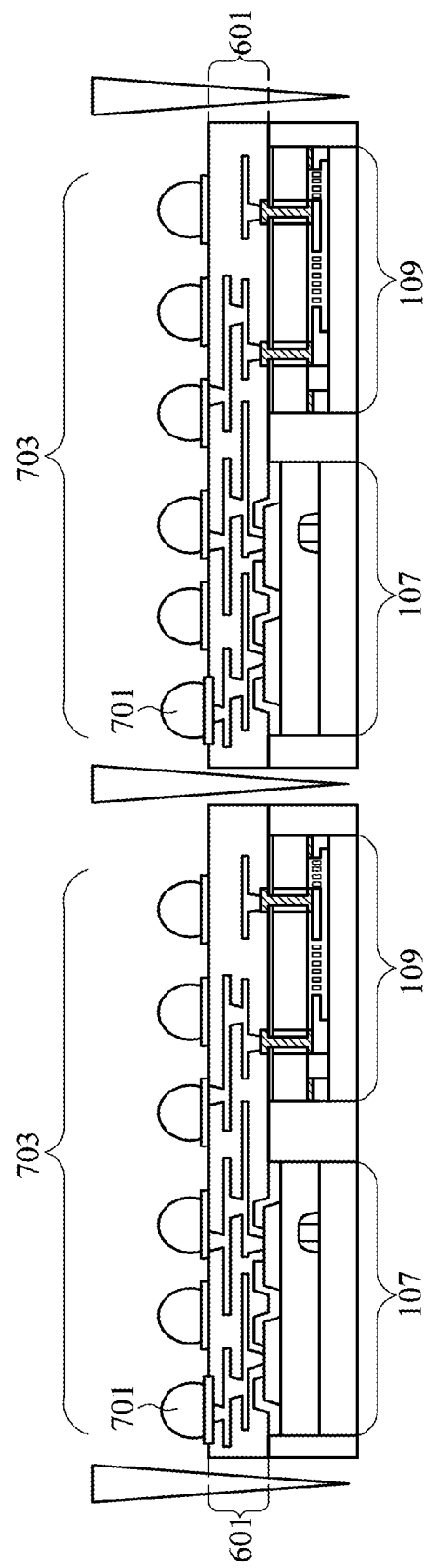

Referring to FIG. 7, connectors 701 are formed over and are electrically coupled to the UBMs 607. In some embodiments, the connectors 701 may be solder balls, metal pillars, controlled collapse chip connection (C4) bumps, ball grid array (BGA) balls, micro bumps, electroless nickel-electroless palladium-immersion gold technique (ENEPIG) formed bumps, or the like. The connectors 701 may include a conductive material such as solder, copper, aluminum, gold, nickel, silver, palladium, tin, the like, or a combination thereof. In some embodiments in which the connectors 701 are solder bumps, the connectors 701 may be formed by initially forming a layer of solder through commonly used methods such as evaporation, electroplating, printing, solder transfer, ball placement, or the like. Once the layer of solder has been formed on the structure, a reflow may be performed in order to shape the material into the desired bump shapes. In other embodiments, the connectors 701 may be metal pillars (such as, for example, copper pillars) formed by a sputtering, printing, electro-chemical plating, electroless plating, PVD, or the like. The metal pillars may be solder free and have substantially vertical sidewalls. In some embodiments, a metal cap layer (not shown) is formed on the top of the metal pillars. The metal cap layer may include a solder, nickel, tin, tin-lead, gold, silver, palladium, indium, nickel-palladium-gold, nickel-gold, the like, or a combination thereof and may be formed by a plating process, or the like.

Referring further to FIG. 7, the carrier 101 is removed from encapsulated first IC dies 107 and second IC dies 109 and the encapsulated first IC dies 107 and second IC dies 109 is diced to form individual integrated circuit packages 703. In some embodiments in which the release layer 103 is formed of an LTHC material, the release layer 103 is exposed to light. The exposure to light causes the release layer 103 to lose its adhesive strength and the carrier 101 is easily detached from the first IC dies 107, the second IC dies 109 and the encapsulant 207. Subsequently, the adhesive layer 105 may be removed to expose the first IC dies 107, the second IC dies 109 and the encapsulant 207. In some embodiments, the encapsulated first IC dies 107 and second IC dies 109 may be diced using, for example, etching, sawing, laser ablation, the like, or a combination thereof. Subsequently, each of the IC packages 703 may be tested to identify known good packages (KGPs) for further processing.

Figure 8A:
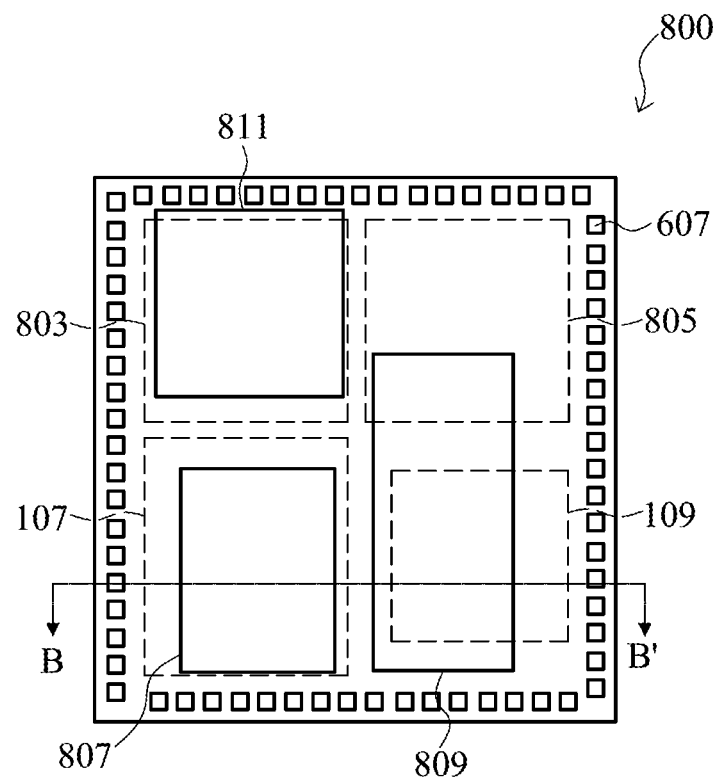
FIGS. 8A and 8B are top and cross-sectional views of a stacked integrated circuit package attached to a printed circuit board in accordance with some embodiments.
Figure 8B:
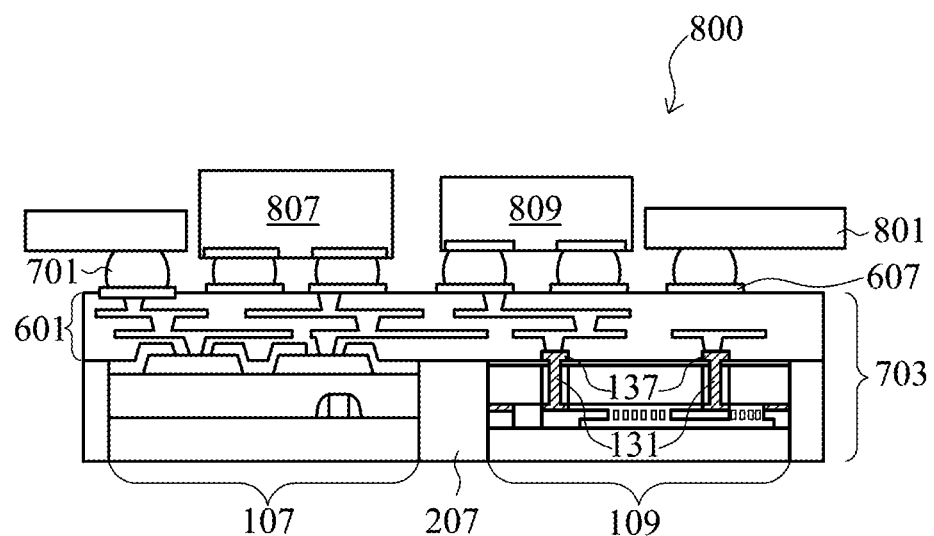

FIGS. 8A and 8B are top and cross-sectional views of a stacked IC package 800 attached to a printed circuit board (PCB) 801 in accordance with some embodiments, where FIG. 8A represents a top view and FIG. 8B represents a cross-sectional view along the B-B' line of the FIG. 8A. For the clarity of presentation, the PCB 801 and the connectors 701 are omitted from the top view illustrated in FIG. 8A. In some embodiments, the PCB 801 has an opening such that the stacked IC package 800 at least partially extends through the opening. In some embodiments, the stacked IC package 800 comprises IC dies 807, 809 and 811 bonded to the IC package 703 using the connectors 701 such that the connectors 701 formed on a peripheral portion of the IC package 703 are used to bond the stacked IC package 800 to the PCB 801. The IC dies 807, 809 and 811 extend through the opening in the PCB 801 and allow the use of the connectors 701 formed on the peripheral portion of the IC package 703 for bonding the stacked IC package 800 to the PCB 801. In some embodiments, the IC package 703 further includes IC dies 803 and 805 in addition to the first IC die 107 and the second IC die 109. In some embodiments, the IC dies 803, 805, 807, 809 and 811 may be CMOS dies, MEMS dies, or the like. The IC dies 803, 805, 807, 809 and 811 may have variety of functionalities and may be memory dies, MCU chips, PMIC chips, RF chips, ASIC chips, LCDs, LED displays, touch sensors, motion sensors, heart rate sensors, ambient sensors such as temperature sensors, pressure sensors, humidity sensors, particle sensors, and the like. In the illustrated embodiment, the first IC die 107 is a MCU chip, the second IC die 109 is a motion sensor chip, the IC die 803 is an RF chip, the IC die 805 is an PMIC chip, the IC die 807 is a temperature sensor, the IC die 809 is a heart rate sensor, and the IC die 809 is a MEMS chip. In some embodiments, the stacked IC package 800 may be a part of a wearable device such as a wrist watch, a health monitoring device, or the like.

Figure 9A:
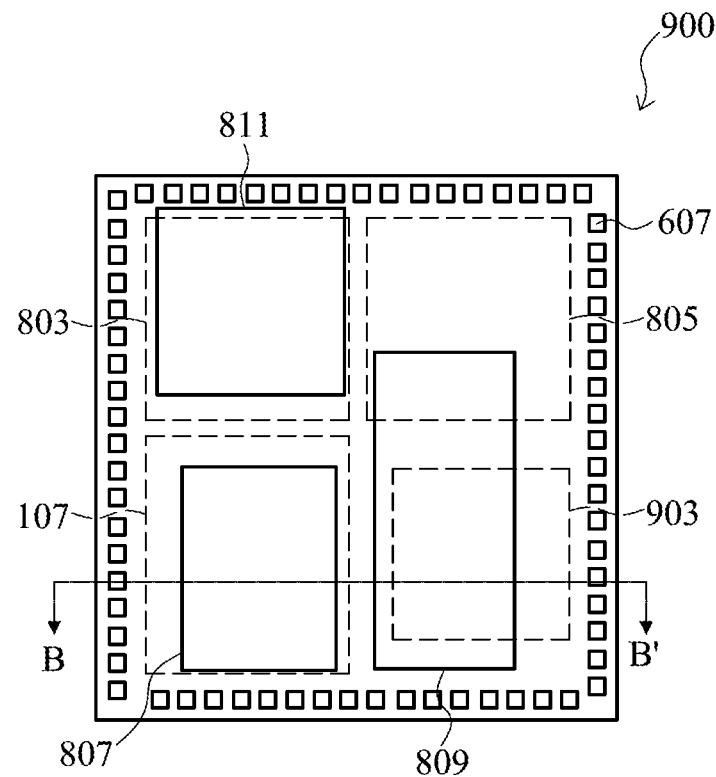
FIGS. 9A and 9B are top and cross-sectional views of a stacked integrated circuit package attached to a printed circuit board in accordance with some embodiments.
Figure 9B:
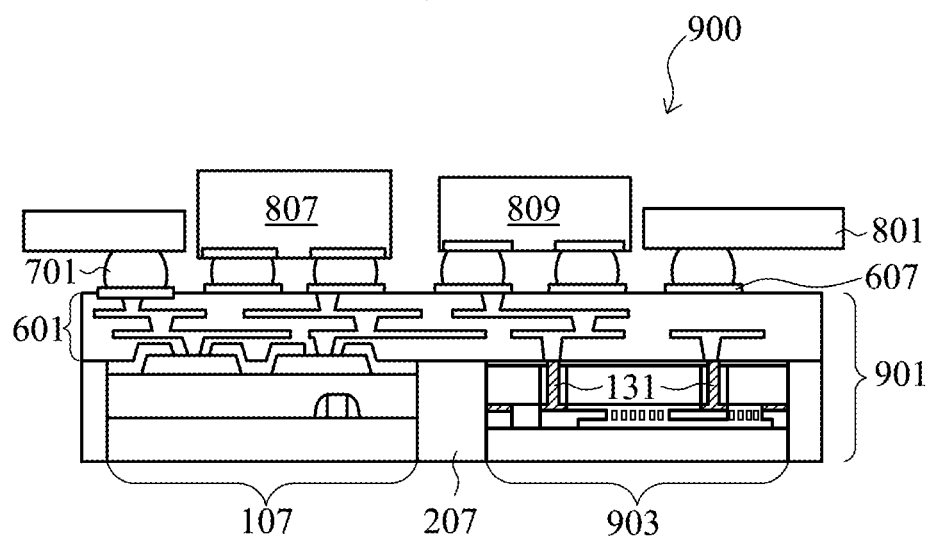

FIGS. 9A and 9B are top and cross-sectional views of a stacked IC package 900 attached to a PCB 801 in accordance with some embodiments, where FIG. 9A represents a top view and FIG. 9B represents a cross-sectional view along the B-B' line of the FIG. 9A. For the clarity of presentation, the PCB 801 and the connectors 701 are omitted from the top view illustrated in FIG. 9A. In some embodiments, the stacked IC package 900 comprises the IC dies 807, 809 and 811 bonded to the IC package 901 using the connectors 701 and may be formed using similar methods as the stacked IC package 800. In some embodiments, the IC package 901 may be formed using similar methods as the IC package 703, described above with reference to FIGS. 1A, 1B, 2A, 2B, 3A, 3B, 4A, 4B, and 5-7 and the description is not repeated herein. Instead of the second IC die 109, the IC package 901 includes an IC die 903. In some embodiments, the IC die 903 differs from the second IC die 109 by a contact pad structure. In contrast to the second IC die 109, the IC die 903 does not include the contact pads 137, and the TVs 131 are directly coupled to the one or more RDLs 601. In some embodiments, the stacked IC package 900 may be a part of a wearable device such as a wrist watch, a health monitoring device, or the like.

Figure 10A:
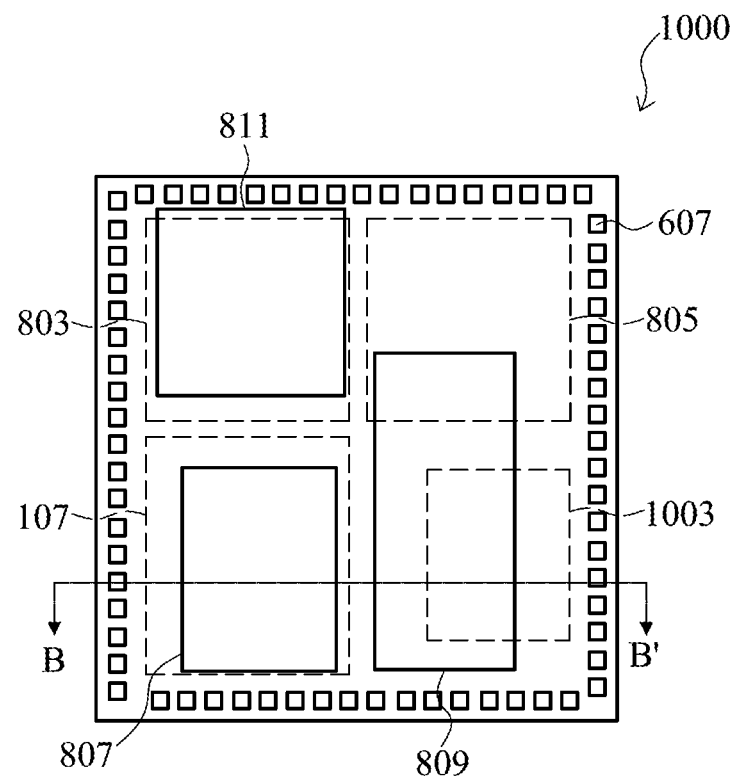
FIGS. 10A and 10B are top and cross-sectional views of a stacked integrated circuit package attached to a printed circuit board in accordance with some embodiments.
Figure 10B:
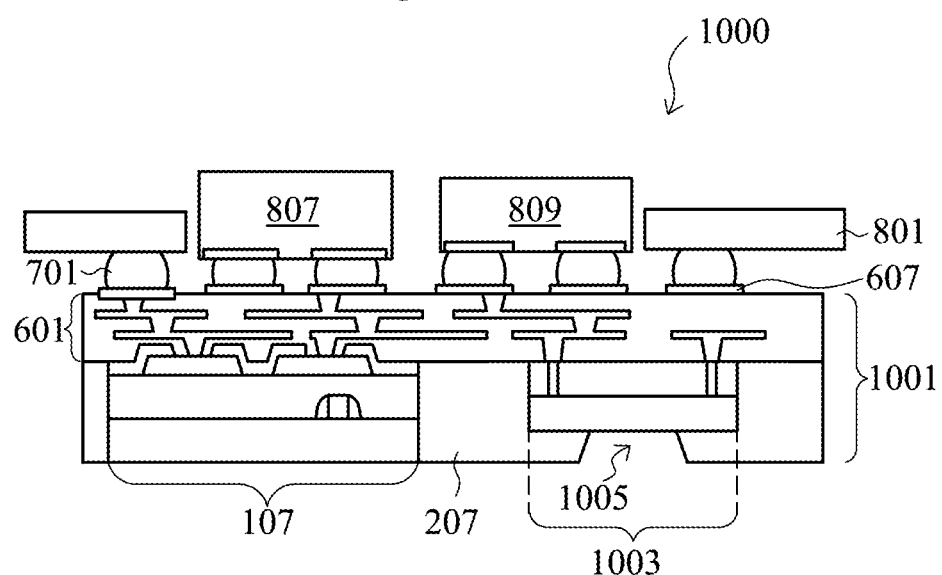

FIGS. 10A and 10B are top and cross-sectional views of a stacked IC package 1000 attached to a PCB 801 in accordance with some embodiments, where FIG. 10A represents a top view and FIG. 10B represents a cross-sectional view along the B-B' line of the FIG. 10A. For the clarity of presentation, the PCB 801 and the connectors 701 are omitted from the top view illustrated in FIG. 10A. In some embodiments, the stacked IC package 1000 comprises the IC dies 807, 809 and 811 bonded to the IC package 1001 using the connectors 701 and may be formed using similar methods as the stacked IC package 800. In some embodiments, the IC package 1001 may be formed using similar methods as the IC package 703, described above with reference to FIGS. 1A, 1B, 2A, 2B, 3A, 3B, 4A, 4B, and 5-7 and the description is not repeated herein. Instead of the second IC die 109, the IC package 1001 includes an IC die 1003. In the illustrated embodiment, the IC die 1003 is an ambient sensor. In such embodiments, an opening 1005 is formed in the encapsulant 207 to expose to the IC die 1003 to the external environment. In some embodiments, the opening 1005 is formed using suitable lithography and etching methods. In some embodiments, the stacked IC package 1000 may be a part of a wearable device such as a wrist watch, a health monitoring device, or the like.

Figure 11A:
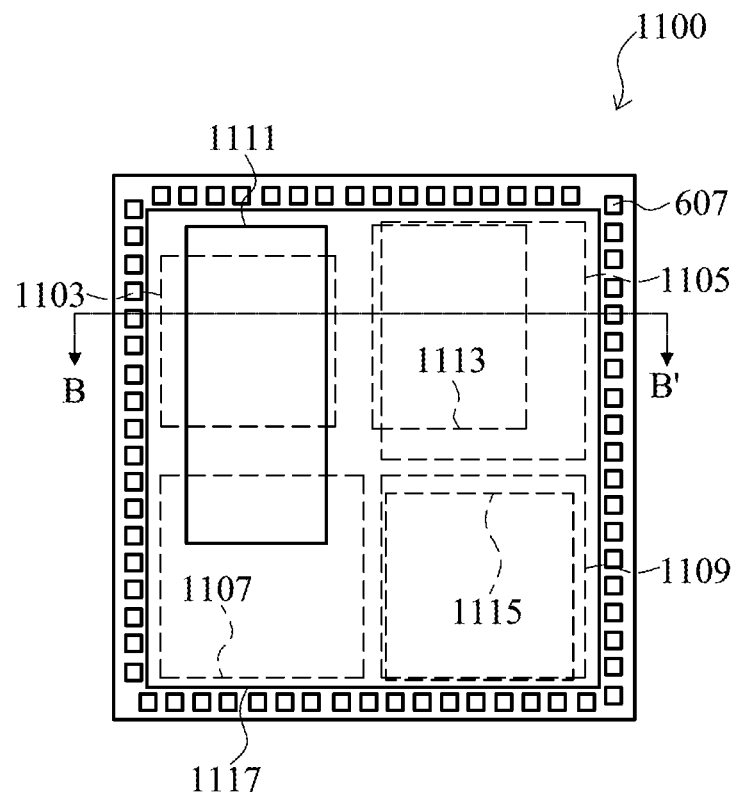
FIGS. 11A and 11B are top and cross-sectional views of a stacked integrated circuit package attached to a printed circuit board in accordance with some embodiments.
Figure 11B:
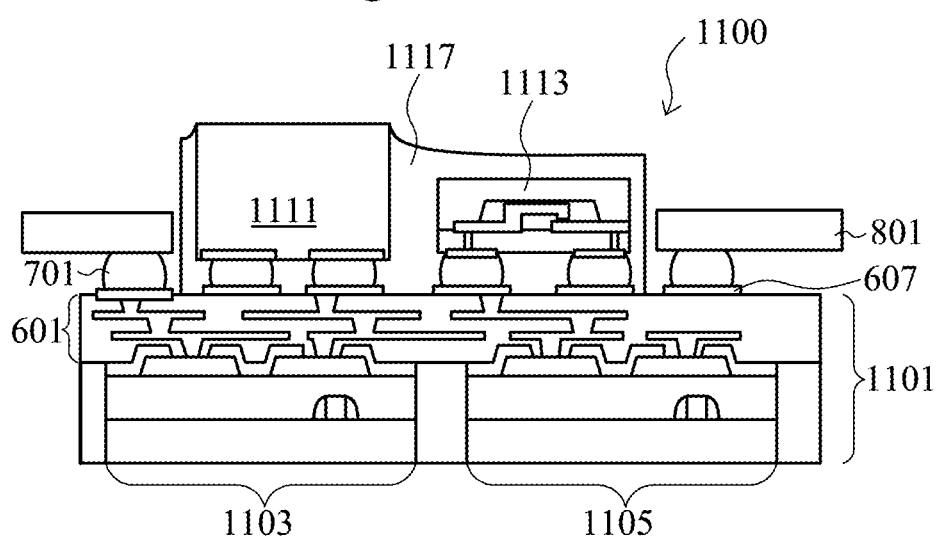

FIGS. 11A and 11B are top and cross-sectional views of a stacked IC package 1100 attached to a PCB 801 in accordance with some embodiments, where FIG. 11A represents a top view and FIG. 11B represents a cross-sectional view along the B-B' line of the FIG. 11A. For the clarity of presentation, the PCB 801 and the connectors 701 are omitted from the top view illustrated in FIG. 11A. In some embodiments, the stacked IC package 1100 comprises IC dies 1111, 1113 and 1115 bonded to an IC package 1101 using the connectors 701 and may be formed using similar methods as the stacked IC package 800. In some embodiments, the IC package 1101 includes IC dies 1103, 1105, 1107 and 1109 and may be formed using similar methods as the IC package 703, described above with reference to FIGS. 1A, 1B, 2A, 2B, 3A, 3B, 4A, 4B, and 5-7 and the description is not repeated herein. In some embodiments, the IC dies 1103, 1105, 1107, 1109, 1111, 1115 and 1115 may be CMOS dies, MEMS dies, or the like. The IC dies 1103, 1105, 1107, 1109, 1111, 1115 and 1115 may have variety of functionalities and may be memory dies, MCU chips, PMIC chips, RF chips, ASIC chips, LCDs, LED displays, touch sensors, motion sensors, heart rate sensors, ambient sensors such as temperature sensors, pressure sensors, humidity sensors, and particle sensors, and the like. In the illustrated embodiment, the IC die 1103 is a PMIC chip, the IC die 1105 is a MCU chip, the IC die 1107 is a PMIC chip, the IC die 1109 is an RF chip, the IC die 1111 is a heart rate sensor, the IC die 1113 is a MEMS chip such as a motion sensor, and the IC die 1115 is a temperature sensor. In some embodiments, an encapsulant 1117 is formed over the IC package 1101, and over and around the IC dies 1111, 1113 and 1115. In some embodiments, the encapsulant 1117 may be formed using similar materials and methods as the encapsulant 207 and the description is not repeated herein. In some embodiments the encapsulant 1117 is planarized using a CMP process, a grinding process, the like, or a combination thereof. In some embodiment, the planarization process is performed until a top surface of the IC die 1111 is exposed. In some embodiments, a mold chase tool (not shown) may be used while forming the encapsulant 1117 to expose the UBMs 607 and the connectors 701 formed along a peripheral portion of the IC package 1101. In some embodiments, the stacked IC package 1100 may be a part of a wearable device such as a wrist watch, a health monitoring device, or the like.

Figure 12:
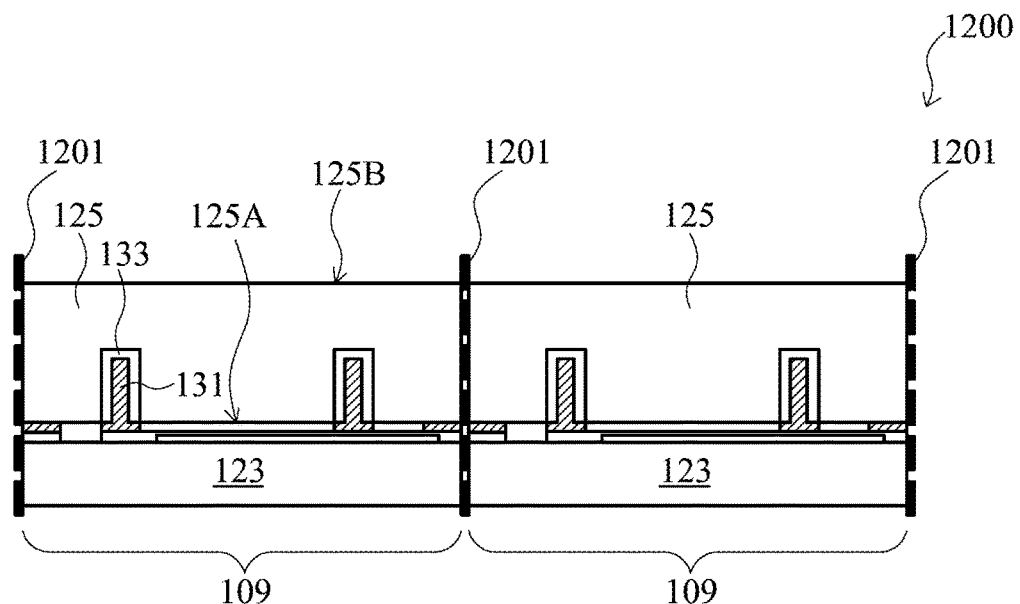
FIGS. 12-15 are cross-sectional views of various processing steps during fabrication of through vias and contact pads in accordance with some embodiments.

FIGS. 12-15 are cross-sectional views of various processing steps during fabrication of the TVs 131 and contact pads 137 of the second IC dies 109 in accordance with some embodiments. Referring first to FIG. 12, a portion of a wafer 1200 including the second IC dies 109 is illustrated, where the neighboring second IC dies 109 are separated by scribe lines 1201. As described below in greater detail, the wafer 1200 is subsequently singulated along the scribe lines 1201 into individual second IC dies 109. In some embodiments, the cap 125 is patterned to form openings on the front side 125A of the cap 125 before bonding the cap 125 to the MEMS substrate 123. FIG. 12 illustrates two openings per each second IC die 109 as an example. However, one skilled in the art will appreciate that the number or the openings may be more than two and may vary according to a design specification for the second IC dies 109. In some embodiments, the cap 125 may be patterned using photolithography techniques. Generally, photolithography techniques involve depositing a photoresist material, which is subsequently irradiated (exposed) and developed to remove a portion of the photoresist material. The remaining photoresist material protects the underlying material, such as the cap 125, from subsequent processing steps, such as etching. A suitable etching process, such as an anisotropic dry etch such as a reactive ion etch (RIE), an isotropic or anisotropic wet etch, or any other suitable etch or patterning process may be applied to remove the exposed portions of the cap 125.

Referring further to FIG. 12, a liner layer 133 is conformally formed over the front side 125A of the cap 125 and in the openings. In some embodiments, the liner layer 133 may comprise a suitable dielectric material and may be formed using CVD, PECVD, sub atmospheric CVD (SACVD), ALD, the like, or combination thereof. The liner layer 133 is configured to electrically isolate subsequently formed TVs 131 from a material of the cap 125. In some embodiments, a barrier/adhesion layer (not shown) is conformally formed over the liner layer 133. The barrier/adhesion layer may be formed using sputtering, PVD, CVD, ALD, the like or a combination thereof. The barrier/adhesion layer is configured to act a diffusion barrier and protect the cap 125 from metal diffusion. The TVs 131 are formed by filling the openings with a conductive material such as aluminum, copper, tungsten, silver, gold, the like, or a combination thereof. In some embodiment, the conductive material is deposited using an electro-chemical plating process, an electroless plating process, ALD, PVD, the like, or a combination thereof. In some embodiments, before filling the openings with the conductive material, a seed layer (not shown) is conformally formed over the barrier/adhesion layer, and the conductive material is deposited over the seed layer. The seed layer may comprise copper, titanium, nickel, gold, manganese, the like, or a combination thereof, and may be formed by ALD, PVD, sputtering, the like, or a combination thereof. In some embodiments, the openings on the front side 125A of the cap 125 are over-filled with the conductive material, which may be removed using an etch process, a CMP process, or the like. After forming the TVs 131 in the cap 125, the cap 125 and the MEMS substrate 123 are boded to form the wafer 1200 having the second IC dies 109. The MEMS substrate 123 may be bonded to the cap 125 using any suitable technique such as fusion bonding (e.g., oxide-to-oxide bonding, metal-to-metal bonding, hybrid bonding, etc.), anodic bonding, eutectic bonding, the like, or a combination thereof.

Figure 13:
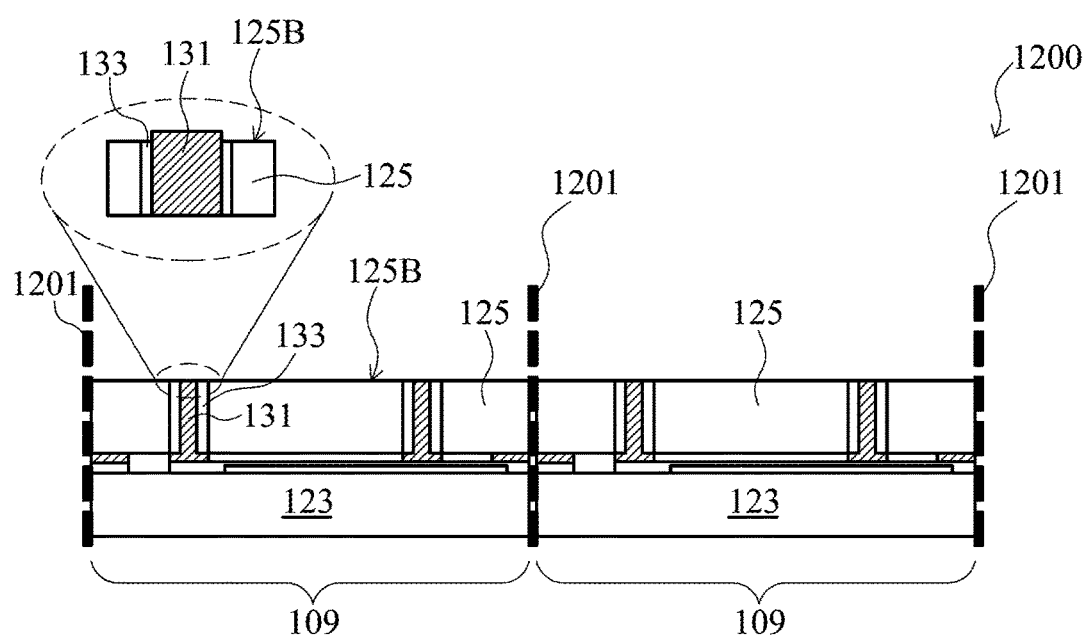

Referring to FIG. 13, the backside 125B of the cap 125 is thinned until the TVs 131 are exposed. In some embodiments, the backside 125B of the cap 125 may be thinned using a grinding process, an etching process, a CMP process, or the like. In some embodiments, the process continues to form contact pads 137 over the backside 125B of the cap 125 and in electrical contact with the TVs 121 as described in greater detail below with reference to FIGS. 14 and 15. In other embodiments, the process strops here and the wafer 1200 may be singulated along the scribe line 1201 before forming contact pads 137. In such embodiments, individual dies such as the IC die 903 illustrated in FIGS. 9A and 9B may be formed.

Figure 14:
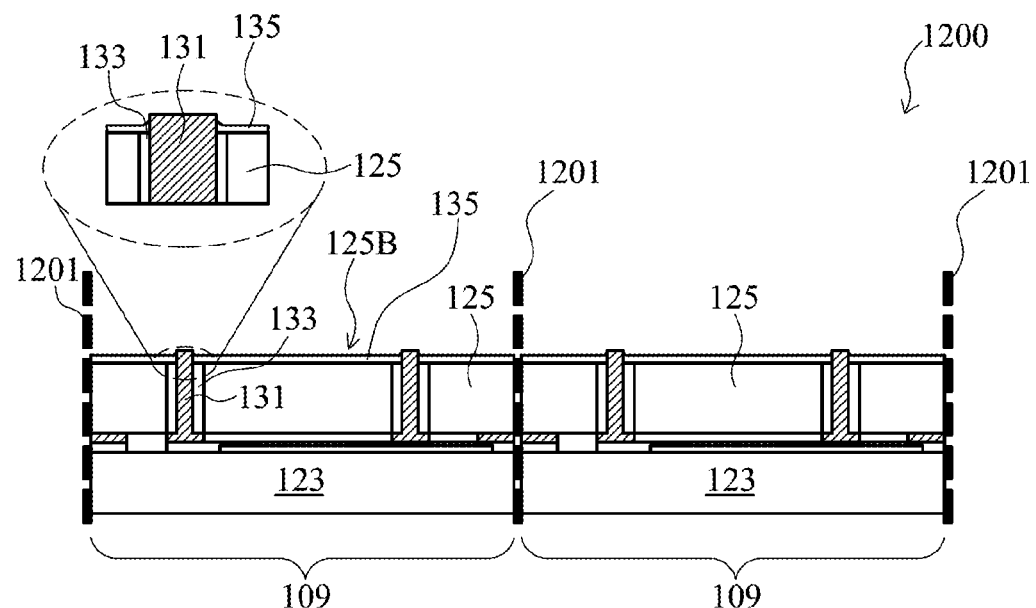

Referring to FIG. 14, a passivation layer 135 is formed on the backside 125B of the cap 125 and over the TVs 131. In some embodiments, the passivation layer 135 may comprise one or more layers of silicon nitride, silicon oxide, silicon oxynitride, PSG, BSG, BPSG, or the like, and may be formed using CVD, PVD, ALD, a spin-on coating process, the like, or a combination thereof. In some embodiments, the passivation layer 135 is planarized until TVs 131 are exposed. In some embodiments, the passivation layer 135 may be planarized using a grinding process, an etching process, a CMP process, or the like. Subsequently, the passivation layer 135 is recessed to expose at least portion of a sidewall of the TVs 131 and form via protrusions extending above a top surface of the passivation layer 135. In some embodiments, the passivation layer 135 may be recessed using a selective etching process, or the like.

Figure 15:
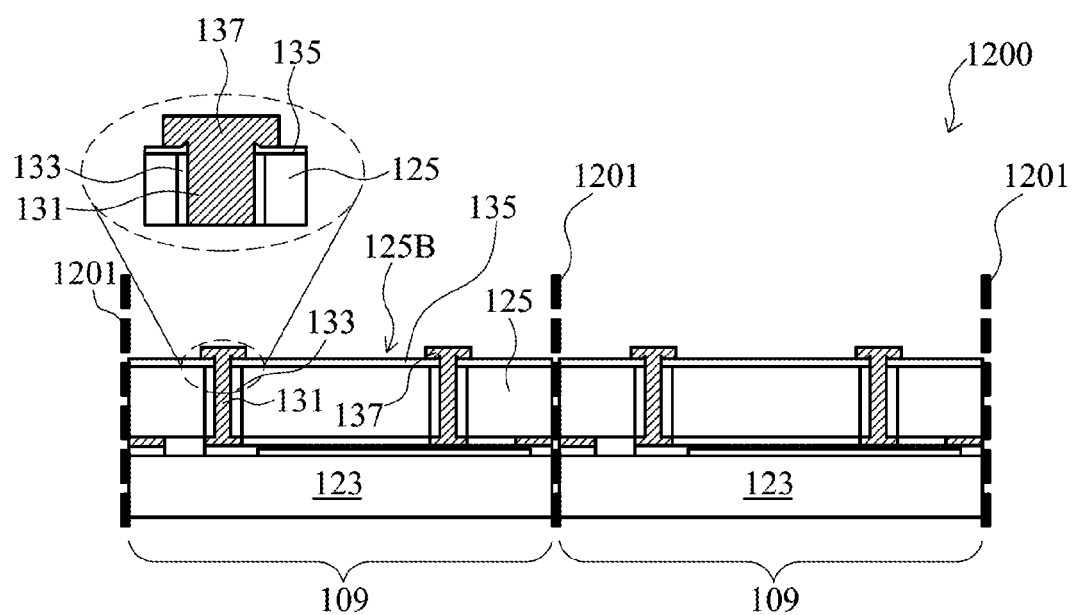

Referring to FIG. 15, contact pads 137 are formed over the passivation layer 135 and in electrical contact with TVs 131. In some embodiments, a sacrificial layer (not shown) may be formed over the passivation layer 135 and patterned to form openings in the sacrificial layer. In some embodiments, the sacrificial layer may comprise a photoresist material, or the like. The openings in the sacrificial layer expose the via protrusions of the TVs 131. In some embodiments, a conductive material such as aluminum, copper, tungsten, silver, gold, nickel, the like, or a combination thereof is deposited in the openings in the sacrificial layer to form the contact pads 137. In other embodiments, a conductive material may be formed over the passivation layer and subsequently patterned to form the contact pads. After completing the formation of the contact pads 137, the wafer 1200 is diced to form individual second IC dies 109. In some embodiments, the wafer may be diced using, for example, etching, sawing, laser ablation, the like, or a combination thereof. Subsequently, each of the second IC dies 109 may be tested to identify known good packages (KGPs) for further processing.

Figure 16:
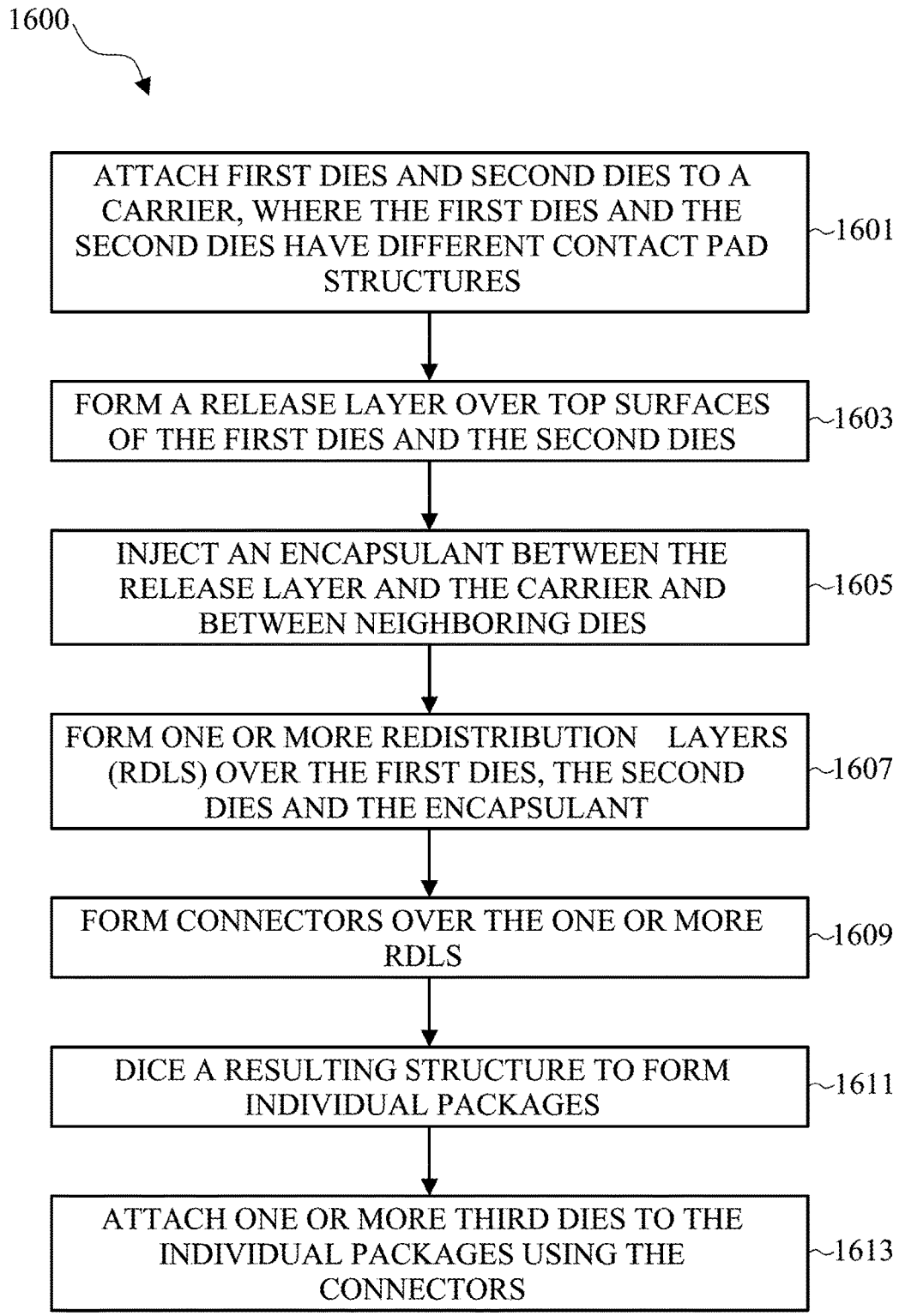
FIG. 16 is a flow diagram illustrating a method of forming integrated circuit packages in accordance with some embodiments.

FIG. 16 is a flow diagram illustrating a method 1600 of forming integrated circuit packages in accordance with some embodiments. The method starts with a step 1601, where first dies (such as the first IC dies 107) and the second dies (such as the second IC dies 109) are attached to a carrier (such as the carrier 101) as described above with reference to FIGS. 1A and 1B. In step 1603, a release layer (such as the release layer 205) is formed over top surfaces of the first dies and the second dies as described above with reference to FIGS. 2A and 2B. In step 1605, an encapsulant (such as the encapsulant 207) is injected between the release layer and the carrier, and between neighboring dies as described above with reference to FIGS. 3A, 3B, 4A and 4B. In step 1607, one or more redistribution layers (such as the one or more RDLs 601) are formed over the first dies, the second dies and the encapsulant as described above with reference to FIG. 6. In step 1609, connectors (such as the connectors 701) are formed over the one or more RDLs as described above with reference to FIG. 7. In step 1611, a resulting structure is de-bonded from the carrier and is diced to form individual packages (such as the IC packages 703) as described above with reference to FIG. 7. In step 1613, one or more dies (such the IC dies 807, 809 and 811) are attached to the individual packages using the connectors as described above with reference to FIG. 8. In some alternative embodiments, step 1613 may be performed before step 1611.

Various embodiments presented herein may provide several advantages. Embodiments such as described herein allow for packaging integrated circuit dies having different contact pad structures into a same integrated circuit package. Furthermore, embodiments such as described herein allow for eliminating certain process steps and allow for reducing manufacturing costs during formation of integrated circuit package. In addition, embodiments such a described herein allow for encapsulation of integrated circuit dies having different contact pad structures without damaging the contact pad structures during the encapsulation process.

In accordance with an embodiment, a method includes attaching a first die and a second die to a carrier, the first die having a first contact pad, the second die having a second contact pad, the first contact pad and the second contact pad having different structures. A release layer is formed over the first die and the second die. An encapsulant is injected between the carrier and the release layer. One or more redistribution layers (RDLs) are formed over the first die, the second die and the encapsulant, the first contact pad and the second contact pad being in electrical contact with the one or more RDLs.

In accordance with another embodiment, a method includes attaching a first side of a first die to a carrier. The first die includes a first contact pad on a second side of the first die, the second side of the first die being opposite the first side of the first die. The first die further includes a first insulating layer on the second side of the first die, at least a portion of the first contact pad being exposed through an opening in the first insulating layer. A first side of a second die is attached to the carrier. The second die includes a through via, the through via extending from the first side of the second die to a second side of the second die, the second side of the second die being opposite the first side of the second die. The second die further includes a second insulating layer on the second side of the second die, at least a portion of the through via extending through the second insulating layer, and a second contact pad over the second insulating layer, the second contact pad contacting the through via. A release layer is laminated over top surfaces of the first contact pad, the second contact pad, the first insulating layer and the second insulating layer. A first encapsulant is injected between the carrier and the release layer, and in a gap between the first die and the second die. One or more redistribution layers (RDLs) are formed over the first die, the second die and the first encapsulant, the first contact pad and the second contact pad being in electrical contact with the one or more RDLs.

In accordance with yet another embodiment, a device includes one or more redistribution layers (RDLs), and a first die on a first side of the one or more RDLs, the first die comprising a first contact pad embedded in a first insulating layer, a conductive feature of the one or more RDLs extending through the first insulating layer and contacting the first contact pad. The device further includes a second die on the first side of the one or more RDLs. The second die includes a through via extending through a second insulating layer, and a second contact pad over the second insulating layer, the second contact pad contacting the through via, at least a portion of a third insulating layer of the one or more RDLs extending along a sidewall of the second contact pad. The device further includes a first encapsulant on the first side of the one or more RDLs, at least a portion of the first encapsulant being interposed between the first die and the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
attaching a first die and a second die to a carrier, the first die having a first contact pad, the second die having a second contact pad, the first contact pad and the second contact pad having different structures;
forming a release layer over the first die and the second die;
injecting an encapsulant between the carrier and the release layer, wherein the encapsulant is over the carrier and under the release layer, and in a gap between the first and second die; and
forming one or more redistribution layers (RDLs) over the first die, the second die and the encapsulant, the first contact pad and the second contact pad being in electrical contact with the one or more RDLs.

2. The method of claim 1, further comprising attaching a third die to the one or more RDLs, the one or more RDLs being interposed between the encapsulant and the third die.

3. The method of claim 1, wherein a topmost surface of the encapsulant is below a topmost surface of the first die.

4. The method of claim 1, wherein a topmost surface of the encapsulant is below a topmost surface of the second contact pad.

5. The method of claim 1, wherein the first contact pad is embedded in a first dielectric layer.

6. The method of claim 5, wherein the second contact pad extends over a second dielectric layer, the second contact pad being in electrical contact with a through via in the second die.

7. The method of claim 1, wherein the first die is a CMOS die, and wherein the second die is a MEMS die.

8. A method comprising:
attaching a first side of a first die to a carrier, the first die having:
a first contact pad on a second side of the first die, the second side of the first die being opposite the first side of the first die; and
a first insulating layer on the second side of the first die, at least a portion of the first contact pad being exposed through an opening in the first insulating layer;
attaching a first side of a second die to the carrier, the second die having:
a through via, the through via extending from the first side of the second die to a second side of the second die, the second side of the second die being opposite the first side of the second die;
a second insulating layer on the second side of the second die, at least a portion of the through via extending through the second insulating layer; and
a second contact pad over the second insulating layer, the second contact pad contacting the through via;
laminating a release layer over top surfaces of the first contact pad, the second contact pad, the first insulating layer and the second insulating layer;
injecting a first encapsulant between the carrier and the release layer, and in a gap between the first die and the second die; and
forming one or more redistribution layers (RDLs) over the first die, the second die and the first encapsulant, the first contact pad and the second contact pad being in electrical contact with the one or more RDLs.

9. The method of claim 8, further comprising:
attaching one or more dies to the one or more RDLs, the one or more RDLs being interposed between the one or more dies and the first encapsulant; and
attaching the one or more RDLs to a circuit board, the circuit board having an opening, the one or more dies extending through the opening.

10. The method of claim 8, further comprising attaching a third die to the one or more RDLs, the one or more RDLs being interposed between the first die and the third die.

11. The method of claim 10, further comprising forming a second encapsulant over the one or more RDLs, at least a portion of the second encapsulant extending along a sidewall of the third die.

12. The method of claim 8, wherein injecting the first encapsulant comprises forcing the first encapsulant into in the gap between the first die and the second die using a plunger.

13. The method of claim 8, wherein a topmost surface of the first contact pad is not coplanar with a topmost surface of the first encapsulant.

14. The method of claim 13, wherein a topmost surface of the second contact pad is not coplanar with the topmost surface of the first encapsulant.

15. A method comprising:
   forming a release layer over a first die, a second die, a third die, and a fourth die, the first, second, third, and fourth dies over and connected to a carrier;
   injecting an encapsulant in gaps between the first die, the second die, the third die, and the fourth die, wherein a topmost surface of the encapsulant is below a topmost surface of the first die, a topmost surface of the second die, a topmost surface of the third die, and a topmost surface of the fourth die;
   forming one or more redistribution layers (RDLs) over the first die, the second die, the third die, the fourth die, and the encapsulant;
   forming connectors over the one or more RDLs;
   de-bonding the carrier to leave a resulting structure comprising the first die, the second die, the third die, the fourth die, the encapsulant, the one or more RDLs, and the connectors over the one or more RDLs; and
   dicing the resulting structure to form a first integrated circuit package and a second integrated circuit package, the first integrated circuit package comprising the first die, the second die, a first subset of the encapsulant, a first subset of the one or more RDLs, and a first subset of the connectors over the first subset of the one or more RDLs, the second integrated circuit package comprising the third die, the fourth die, a second subset of the encapsulant, a second subset of the one or more RDLs, and a second subset of the connectors over the second subset of the one or more RDLs.

16. The method of claim 15 further comprising attaching one or more fifth dies over the first subset of the connectors of the first integrated circuit package.

17. The method of claim 15 further comprising attaching one or more sixth dies over the second subset of the connectors of the second integrated circuit package.

18. The method of claim 15 wherein the first die and the third die are CMOS dies.

19. The method of claim 18 wherein the second die and the fourth die are ambient sensors.

20. The method of claim 18 further comprising testing the first integrated circuit package and the second integrated circuit package to identify known good packages (KGPs).

* * * * *